(12) United States Patent
Shin

(10) Patent No.: US 6,991,983 B2
(45) Date of Patent: Jan. 31, 2006

(54) METHOD OF MANUFACTURING HIGH VOLTAGE TRANSISTOR IN FLASH MEMORY DEVICE

(75) Inventor: Young Ki Shin, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/737,559

(22) Filed: Dec. 16, 2003

(65) Prior Publication Data

US 2004/0241941 A1    Dec. 2, 2004

(30) Foreign Application Priority Data

May 29, 2003    (KR)    ...................... 10-2003-0034546

(51) Int. Cl.
*H01L 21/336*    (2006.01)
(52) U.S. Cl. ...................... 438/257; 438/439; 438/450; 438/257

(58) Field of Classification Search ................. 438/257
See application file for complete search history.

(56) References Cited

U.S. PATENT DOCUMENTS

| | | | | |
|---|---|---|---|---|
| 6,207,510 B1 * | 3/2001 | Abeln et al. | ................. | 438/276 |
| 6,573,556 B2 * | 6/2003 | Doong et al. | ................ | 257/315 |
| 6,759,299 B2 * | 7/2004 | Lee et al. | .................... | 438/258 |

* cited by examiner

*Primary Examiner*—Thao P. Le
(74) *Attorney, Agent, or Firm*—Marshall, Gerstein & Borun LLP

(57) ABSTRACT

Disclosed is a method of manufacturing a high voltage transistor in a flash memory device. The method can prohibit a punch leakage current of an isolation film while satisfying active characteristics of the high voltage transistor without the need for a mask process for field stop of the high voltage transistor ion implantation process and a mask removal process.

13 Claims, 8 Drawing Sheets

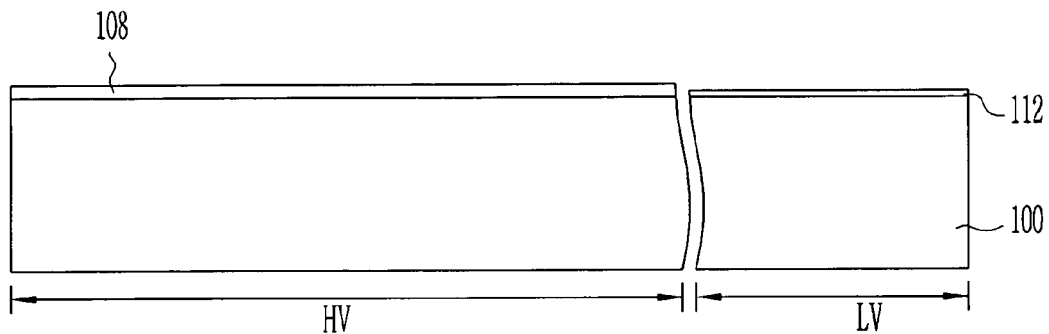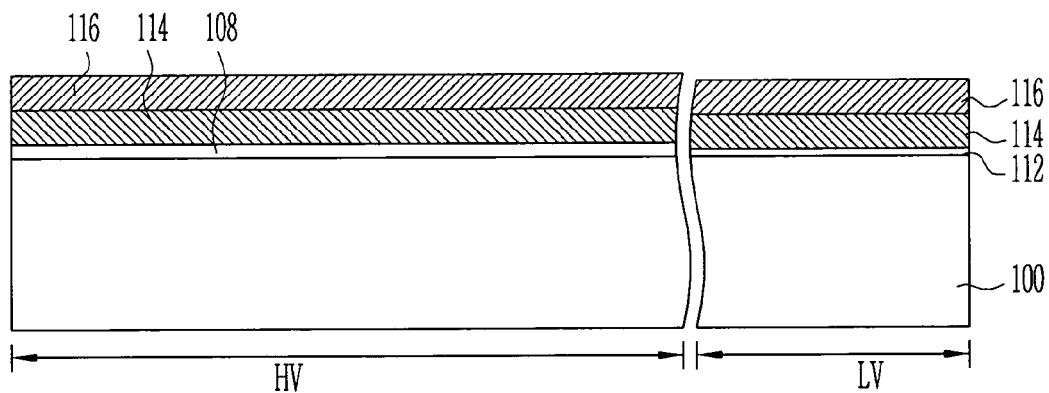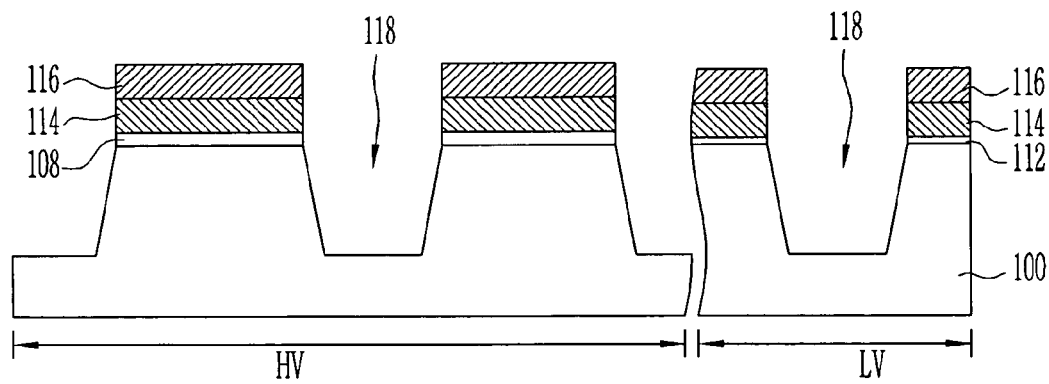

METHOD OF MANUFACTURING HIGH VOLTAGE TRANSISTOR IN FLASH MEMORY DEVICE

BACKGROUND

1. Field of the Invention

The present invention relates to a method of manufacturing a semiconductor device and, more particularly, to a method of manufacturing a high voltage transistor in a flash memory device, which can prohibit a punch leakage current of an isolation film while satisfying active characteristics of the high voltage transistor without the need for a mask process for field stop of the high voltage transistor, ion implantation process, and a mask removal process.

2. Discussion of Related Art

In case of a NAND type flash memory device, in order to satisfy the characteristics of a transistor in an active region and an isolation punch leakage, in forming a high voltage NMOS transistor, an ion implantation for controlling a threshold voltage of the high voltage NMOS transistor and a field stop ion implantation of the high voltage NMOS transistor are performed using different masks. This causes the number of entire process steps and the number of masks to increase, thus resulting in reduction of the productivity.

FIG. 1 is a sectional view for explaining a method of manufacturing a high voltage transistor of a conventional flash memory device. In FIG. 1, a reference numeral indicates a semiconductor substrate, 8 a gate oxide film for a high voltage device, 12 a gate oxide film for a low voltage device, 14 a polysilicon film, 16 a pad nitride film, 18 a trench and 19 a high voltage NMOS transistor field stop ion implantation.

As shown in FIG. 1, in forming the field region of the high voltage NMOS transistor, a field stop ion implantation mask for the high voltage NMOS transistor is formed to overlap 0.5 um in the active region. Field stop ion implantation process of the high voltage NMOS transistor is then performed. The reason why the mask overlaps in the active region is for the doping profile of field stop ion implantation of the high voltage NMOS transistor not to affect the active region. Accordingly, a portion for which field stop ion implantation of the high voltage NMOS transistor is performed does not cover the entire bottom of the trench isolation film but is locally formed at the bottom. At this time, the depth of the trench in the isolation film is about 300 Å. In order to perform field stop ion implantation of the high voltage NMOS transistor as above, not only a mask used in the photolithography process is required but also several process steps such as a photoresist covering process, a photoresist exposure process, a photoresist development process, a field stop ion implantation process, a photoresist removal process, etc. have to be carried out.

Meanwhile, in case of the active region, in order to satisfy a high voltage characteristic required for the NAND type flash memory device, ion implantation process for controlling the threshold voltage of the high voltage NMOS transistor is applied for a P type substrate by using a mask for controlling the threshold voltage of the high voltage NMOS transistor.

As such, in the prior art, the ion implantation process for controlling the threshold voltage of the high voltage NMOS transistor and the field stop ion implantation of the high voltage NMOS transistor are performed separately.

SUMMARY OF THE INVENTION

The present invention is directed to provide a method of manufacturing a high voltage transistor in a flash memory device. According to a preferred embodiment of the present invention, there is provided a method of manufacturing a high voltage transistor in a flash memory device capable of prohibiting a punch leakage current of an isolation film, and satisfying an active characteristic of the high voltage transistor without the need for a mask process for field stop of the high voltage transistor, an ion implantation process and a mask removal process.

One aspect of the present invention is to provide a method of manufacturing a high voltage transistor in a flash memory device, comprising the steps of: performing an ion implantation process for controlling a threshold voltage of a high voltage transistor for a semiconductor substrate; forming a gate oxide film for a high voltage device on the semiconductor substrate; forming a pad nitride film on the gate oxide film for the high voltage device and then forming a shallow trench into the semiconductor substrate; burying the shallow trench with an insulating film to form an isolation film; removing the pad nitride film; forming a polysilicon film on the semiconductor substrate and then patterning the polysilicon film to form a gate electrode of the high voltage transistor; and performing the ion implantation process to form a source/drain junction of the high voltage transistor.

In the aforementioned of a method of manufacturing a high voltage transistor in a flash memory device according to another embodiment of the present invention, the ion implantation process for controlling the threshold voltage of the high voltage transistor is performed with a high energy in the range of about 60 KeV to 80 KeV so as to prevent a punch leakage at a bottom of the isolation film of the shallow trench.

In the aforementioned of a method of manufacturing a high voltage transistor in a flash memory device according to another embodiment of the present invention, the ion implantation process for controlling the threshold voltage of the high voltage transistor is performed with a dose in the range of about 8.0E11 atoms/cm$^2$ to 1.5E12 atoms/cm$^2$.

In the aforementioned of a method of manufacturing a high voltage transistor in a flash memory device according to another embodiment of the present invention, the shallow trench is formed with a depth in the range of about 1000 Å to 2000 Å so as to prevent a punch leakage current at a bottom of the isolation film.

In the aforementioned of a method of manufacturing a high voltage transistor in a flash memory device according to another embodiment of the present invention, the ion implantation process for forming the source/drain junction of the high voltage transistor is performed with a low energy in the range of about 30 KeV to 50 KeV in order to prevent a punch leakage of the isolation film due to the shallow trench.

In the aforementioned of a method of manufacturing a high voltage transistor in a flash memory device according to another embodiment of the present invention, the ion implantation process for forming the source/drain junction of the high voltage transistor is performed with a low dose in the range of about 3.0E12 atoms/cm$^2$ to 1E13 atoms/cm$^2$ so as to satisfy a high drain junction breakdown voltage.

In the aforementioned of a method of manufacturing a high voltage transistor in a flash memory device according to another embodiment of the present invention, further comprising the step of depositing a polysilicon film on the gate oxide film for the high voltage device before the pad nitride film is formed.

BRIEF DESCRIPTION OF THE DRAWINGS

The above and other objects, features and advantages of the present invention will become apparent from the following description of preferred embodiments given in conjunction with the accompanying drawings, in which:

FIGS. 3 to 12 are sectional views for explaining a method of manufacturing a high voltage transistor of a flash memory according to a preferred embodiment of the present invention, wherein FIGS. 3 to 11 are sectional views of the devices taken along lines I–I' in FIG. 2 and FIG. 12 is a sectional view of the device taken along lines II–II' in FIG. 2;

DETAILED DESCRIPTION OF PREFERRED EMBODIMENTS

Figure 1:
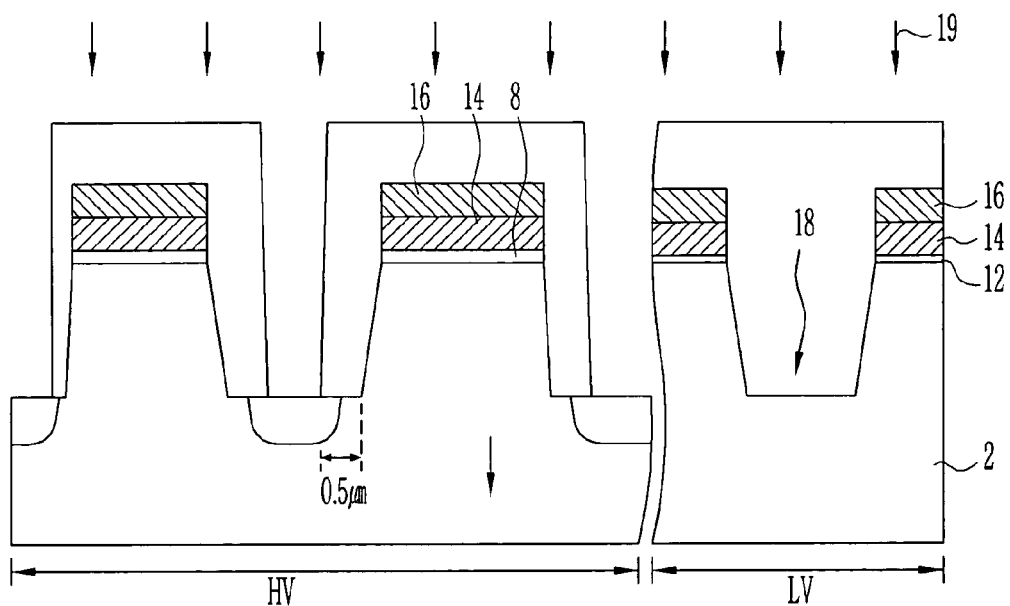
FIG. 1 is a sectional view for explaining a method of manufacturing a high voltage transistor of a conventional flash memory device.

The present invention will now be described in detail in connection with preferred embodiments with reference to the accompanying drawings, in which like reference numerals are used to identify the same or similar parts.

FIGS. 2 to 12 show a method of manufacturing a high voltage transistor of a flash memory device according to a preferred embodiment of the present invention.

Figure 2:
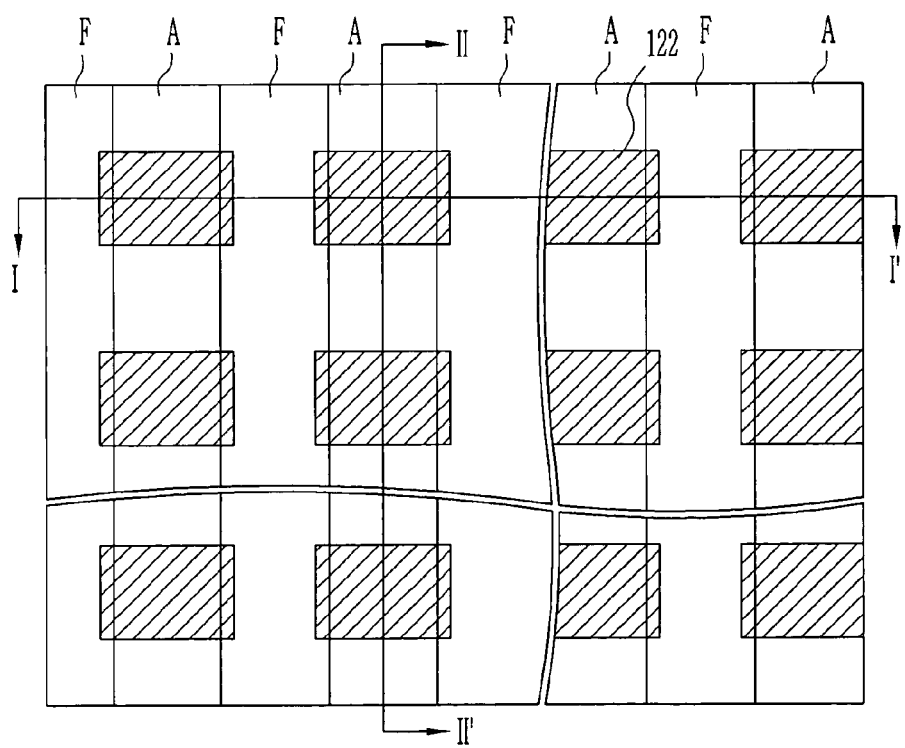
FIG. 2 is a layout view of a flash memory device according to a preferred embodiment of the present invention.

FIG. 2 is a layout view of a flash memory device according to a preferred embodiment of the present invention. FIGS. 3 to 11 are sectional views of the devices taken along lines I–I' in FIG. 2 and FIG. 12 is a sectional view of the device taken along lines II–II' in FIG. 2. In FIG. 2, a reference numeral A indicates an active region, a reference numeral F an isolation region, 122 a second polysilicon film pattern.

Figure 3:
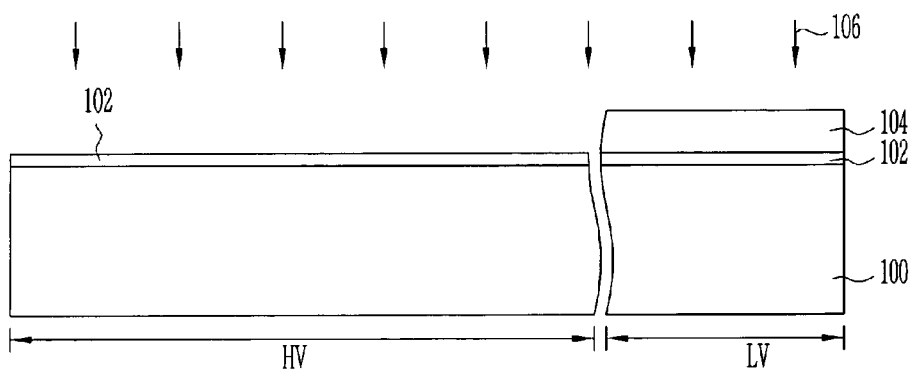

Referring to FIG. 3, a screen oxide film 102 serving as a buffer layer at the time of an ion implantation process for controlling a threshold voltage ($V_T$) of a high voltage device region HV, is formed on a semiconductor substrate 100 in which a high voltage device region HV and a low voltage device region LV are defined. It is preferred that the screen oxide film 102 is formed in thickness of about 50 Å to 150 Å.

Thereafter, after a photoresist pattern 104 for opening the high voltage device region HV but shielding the low voltage device region LV is formed, ion implantation process 106 for controlling the threshold voltage ($V_T$) of the high voltage device region HV is performed. Preferably, ion implantation process 106 for controlling the $V_T$ of the high voltage device region HV is carried out in a dose of about 8.0E11 atoms/$cm^2$ to 1.5E12 atoms/$cm^2$ with energy of about 60 KeV to 80 KeV. The ion implantation process for controlling the $V_T$ of the high voltage NMOS transistor serves to prevent a punch leakage at the bottom of the isolation film after subsequent thin trench (see '118' in FIG. 8) is formed.

Figure 4:
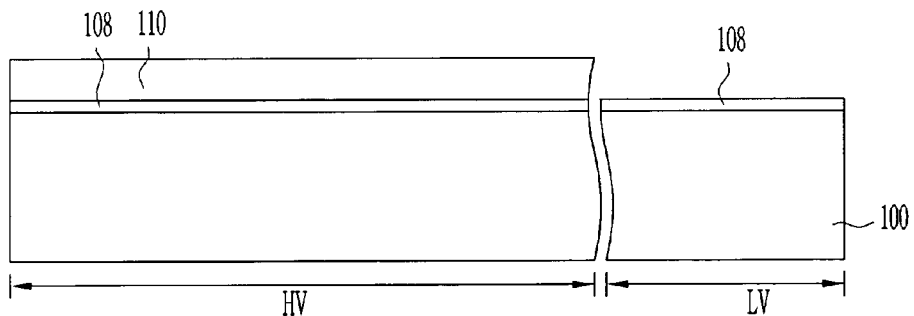

By reference to FIG. 4, the photoresist pattern 104 and the screen oxide film 102 left on the semiconductor substrate 100 are removed. The screen oxide film 102 may be removed a DHF solution (diluted HF; for example, a HF solution where water and HF are diluted at the ratio of about 50:1) or a BOE solution (buffer oxide etchant; for example, a solution where HF and $NH_4F$ are mixed at the ratio of about 100 to 300:1).

A gate oxide film for a high voltage device 108 is formed on the semiconductor substrate 100 including the high voltage device region HV and the low voltage device region LV. It is preferable that the gate oxide film for a high voltage device 108 is formed in thickness of 300 Å to 400 Å by using $H_2$ gas and $O_2$ gas. The gate oxide film for the high voltage device 108 may also be formed by way of a wet oxidization method.

A photoresist pattern 110 for shielding the high voltage device region HV and opening the low voltage device region LV is then formed.

Figure 5:
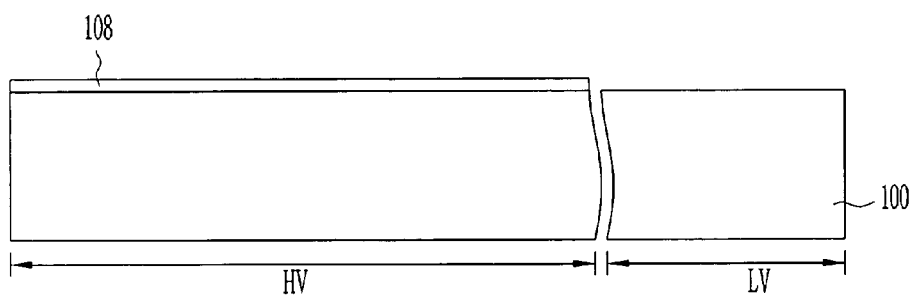

With reference to FIG. 5, the gate oxide film for a high voltage device 108 formed in the low voltage device region LV is etched using the photoresist pattern 110 as an etch mask. The photoresist pattern 110 is then removed.

Referring to FIG. 6, a gate oxide film for a low voltage device in the low voltage device region LV. It is preferred that the gate oxide film for a low voltage device 112 is formed in thickness of 30 Å to 100 Å by using $H_2$ gas and $O_2$ gas. As such, the oxide film for a high voltage device 108 is formed in the high voltage device region HV and the gate oxide film for a low voltage device 112 is formed in the low voltage device region LV.

With reference to FIG. 7, a first polysilicon film 114 and a pad nitride film 116 are sequentially formed over the semiconductor substrate 100 including the high voltage device region HV and the low voltage device region LV. The first polysilicon film 114 may be formed by means of a low pressure-chemical vapor deposition (LP-CVD) method using a $SiH_4$ gas or $Si_2H_6$ gas and $PH_3$ gas. It is preferable that the first polysilicon film 114 is formed in thickness of about 200 Å to 500 Å at a low pressure of about 0.1 Torr to 3 Torr and a temperature of about 500° C. to 620° C.

Meanwhile, the pad nitride film 116 may be formed by means of the LP-CVD method. The pad nitride film 116 may be formed with a thickness in the range of 200 Å to 1000 Å at a low pressure in the range of 50 mtorr to 800 mtorr and a temperature in the range of 700° C. to 900° C. using, for example DCS (dichloro silane; $SiH_2Cl_2$) and $NH_3$ gases.

In the present embodiment, it is to be understood that the deposition process of the first polysilicon film 114 may be omitted so as to perform only isolation without formation of the first polysilicon film 114 to be used as the gate electrode.

By reference to FIG. 8, a photoresist pattern (not shown) to define a trench is formed on the semiconductor substrate 100 including the high voltage device region HV and the low voltage device region LV. A shallow trench 118 is formed within the semiconductor substrate 100 using the photoresist pattern as the etch mask. The shallow trench 118 is formed in depth of about 1000 Å to 2000 Å, preferably about 1000 Å.

Figure 9:
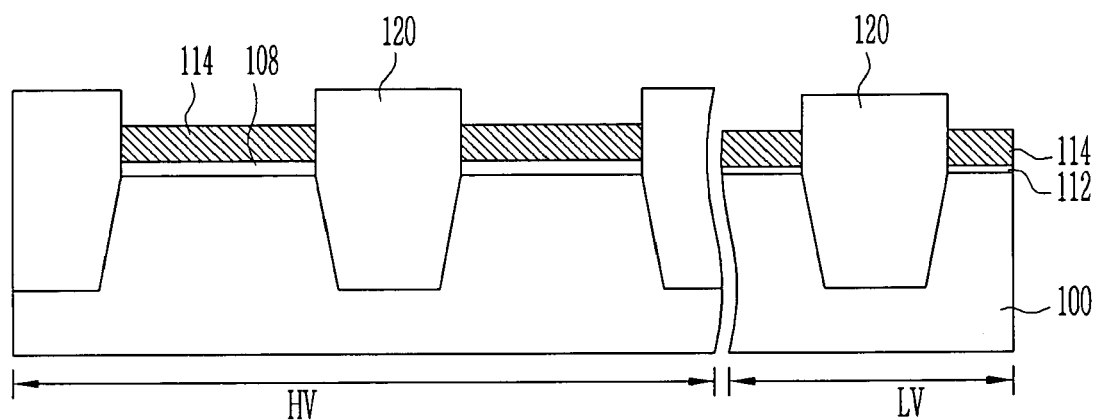

Referring now to FIG. 9, after an insulating film is deposited in order to fill the shallow trench 118 with it, the insulating film on the pad nitride film 116 is polished by chemical mechanical polishing, thereby forming a shallow trench isolation (ISO) film 120. The semiconductor substrate 100 has the active region (see 'A' in FIG. 2) and the isolation region (see 'F' on FIG. 2) defined by the isolation film 120. The insulating film that is buried within the shallow trench 118 may include a high-density plasma (HDP) film.

The pad nitride film 116 is then stripped off. At this time, the pad nitride film 116 may be removed using a phosphoric acid ($H_3PO_4$) solution.

Figure 10:
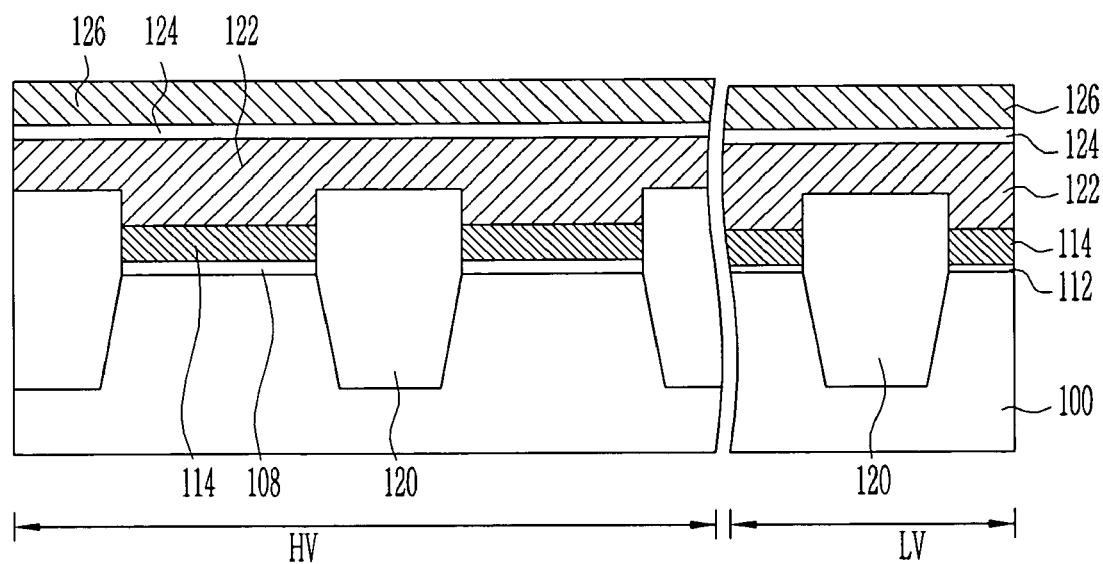

By reference to FIG. 10, a second polysilicon film 122, a silicide film 124 and a hard mask film 126 are sequentially formed on the semiconductor substrate 100 including the high voltage device region HV and the low voltage device region LV. The second polysilicon film 122 may be formed by means of the LP-CVD method using a $SiH_4$ gas or $Si_2H_6$ gas and $PH_3$ gas. Preferably, the second polysilicon film 122 is formed in thickness of about 1000 Å to 3000 Å at a low pressure in the range of about 0.1 Torr to 3 Torr and a temperature in the range of about 500° C. to 620° C. The silicide film 124 may consist of a tungsten silicon (WSi) film. The tungsten silicon (WSi) film may be formed using reaction of $SiH_4$ (momosilane; MS) or $SiH_2Cl_2$ (dichlorosilane; DCS) and $WF_6$ at a temperature of 300° C. to 500° C. Further, the hard mask film 126 may be formed using a silicon nitride ($Si_3N_4$) film or a silicon oxynitride (SiON) film.

Figure 11:
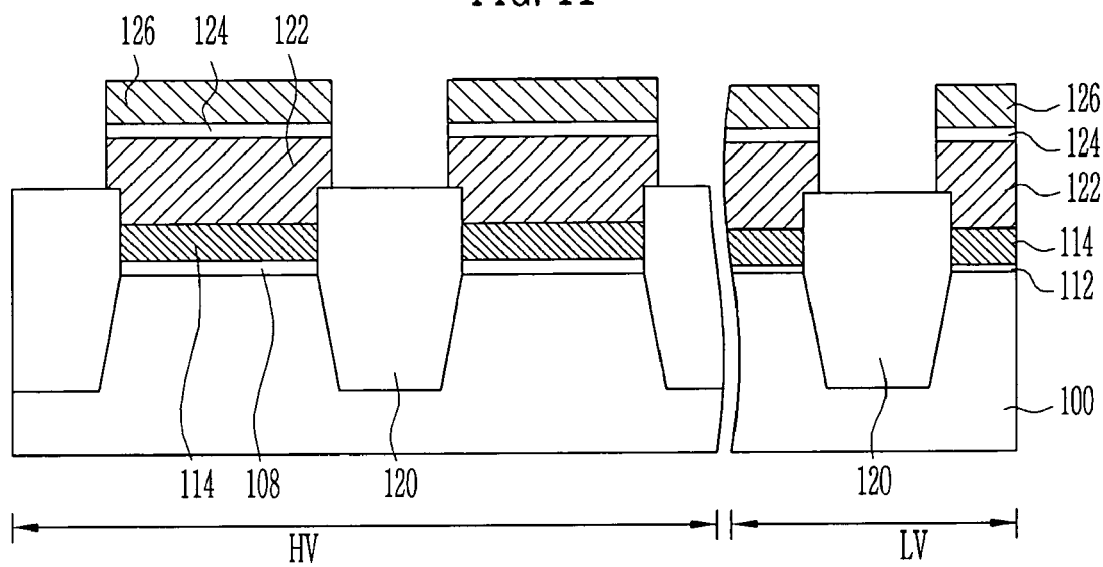
Figure 12:
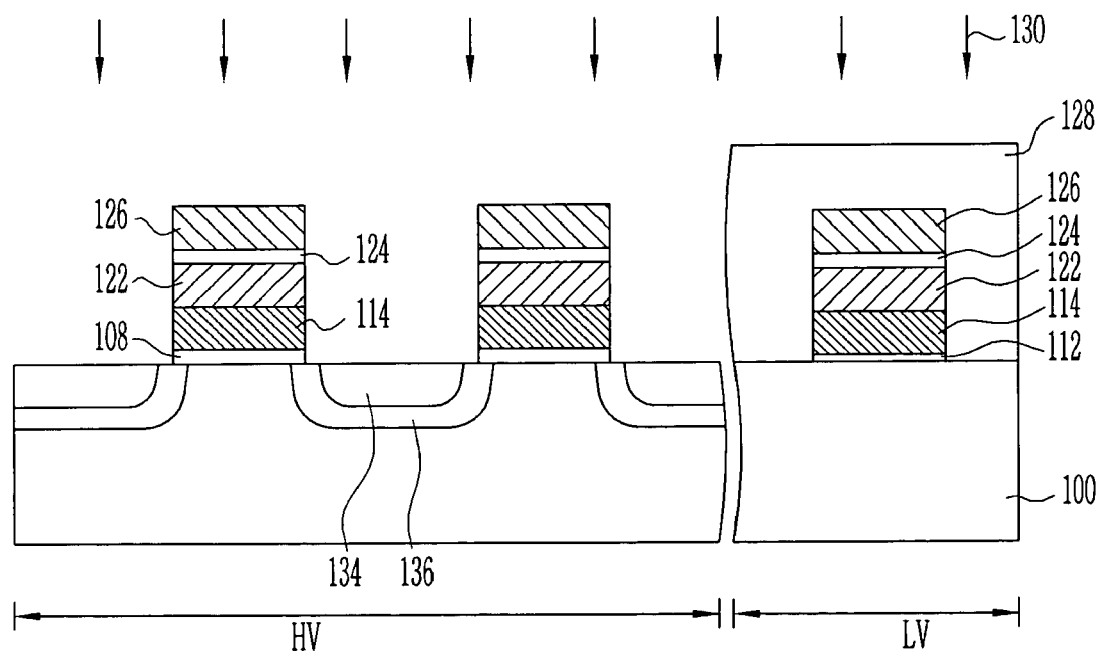

With reference to FIG. 11, the hard mask film 126, the silicide film 124, the second polysilicon film 122 are patterned through a patterning process using a gate mask, so that a gate electrode is formed in the high voltage device region A and the low voltage device region B, respectively.

Referring to FIG. 12, in order to form source/drain 134, 136, the high voltage device region HV is opened and a photoresist pattern 128 shielding the low voltage device region LV is formed. The source/drain 134 of the low concentration is formed in the high voltage device region HV using the photoresist pattern 128 as an ion implantation mask. It is preferred that ion implantation process is performed with low energy of 30KeV to 50Kev in order to strengthen weakened punch characteristic of the isolation film due to STI. Further, so as to satisfy a high drain junction breakdown voltage upon ion implantation process for formation of the source/drain 134, a second ion implantation process 130 is preferably affected at a low dose of about 3.0E12 atoms/$cm^2$ to 1E13 atoms/$cm^2$. In order to form source/drain 134, 136 of a double doped drain (DDD) structure, a source/drain junction 136 of a high concentration is formed.

In the concrete, the process of forming the source/drain 134, 136 having the DDD structure will be again examined. After forming the photoresist pattern 128 for opening the high voltage device region HV and shielding the low voltage device region LV, a low concentration impurity region 134 is formed by a low-concentration ion implantation process using the gate electrode (or hard mask film) as the ion implantation mask. It is preferable that the low-concentration implantation process is performed at a low dose of about 3.0E12 atoms/cm to 1.0E13 atoms/$cm^2$ with low energy of about 30 KeV to 50 Kev.

Thereafter, after a photoresist pattern (not shown) defining a high concentration impurity region is formed so as to form the high concentration impurity region 136, a high-concentration ion implantation process is carried out using the photoresist pattern as the ion implantation mask. Preferably, the high-concentration ion implantation process is affected at a low dose of about 1.0E14 atoms/$cm^2$ to 1.0E15 atoms/$cm^2$ with low energy of about 10 KeV to 30 Kev. The photoresist pattern 128 formed in the low voltage device region LV and the photoresist pattern, which is defining the high concentration impurity region, are then removed. A rapid thermal annealing process for activating impurities implanted after the impurity ion implantation of the high concentration is performed. The source/drain 134, 136 of the DDD structure having the low concentration impurity region 134 and the high concentration impurity region 136 are thus formed. In the above, terms "ion implantation process for forming the source/drain of the DDD structure" indicates "ion implantation process for forming the low concentration impurity region 134" in the following description.

In the process according to a preferred embodiment of the present invention, ion implantation process for controlling the $V_T$ of the high voltage NMOS transistor may serve to prevent the isolation film punch leakage below shallow trench isolation (STI) after the shallow trench is formed.

In the case of the NAND type flash memory device, regarding the junction breakdown voltage of the high voltage NMOS transistor, so as to satisfy a characteristic higher than 27V and reduce the body effect, ion implantation process for controlling the threshold voltage of the high voltage NMOS transistor is implemented for the P type substrate. At this time, ion implantation process is preferably affected using boron (B) of 8.0E11@50 KeV. In order for this condition to meet the isolation film punch characteristic (>27V), it is required that the trench depth of STI be lowered since the characteristic is rarely satisfied in the depth of 3000 Å.

Figure 13:
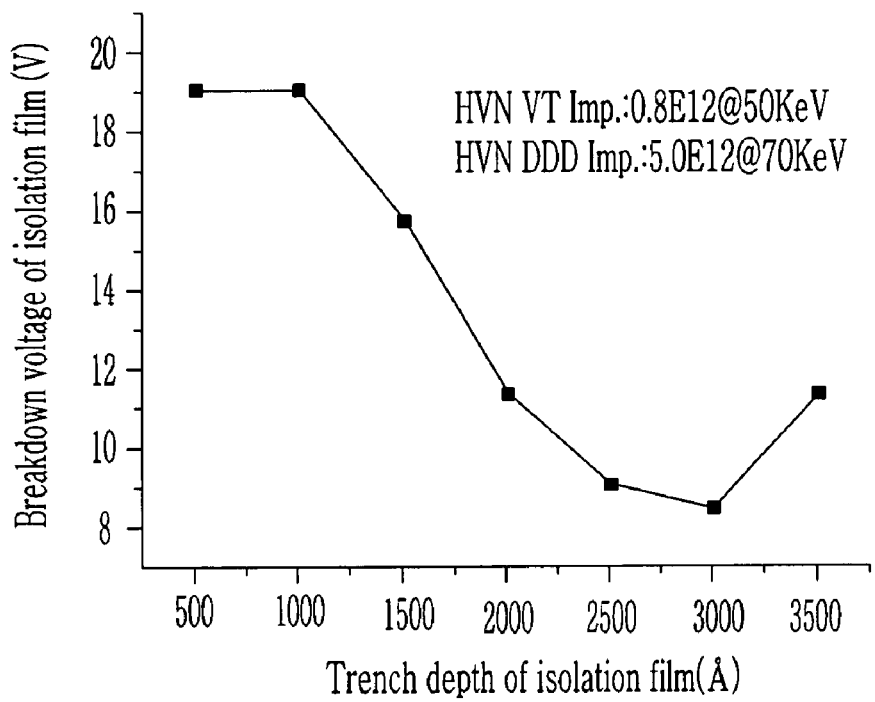
FIG. 13 is a graph showing the result of the breakdown voltage depending on the depth of a trench in the isolation film.

FIG. 13 is a graph showing the result that the breakdown voltage of the isolation film depending on the trench depth in the isolation film is simulated. In FIG. 13, there is shown the graph where ion implantation process for controlling the threshold voltage of the high voltage NMOS transistor is performed in a dose of about 0.8E12 atoms/$cm^2$ with energy of about 50 KeV and ion implantation process for forming the source/drain of the DDD structure in the high voltage NMOS transistor is carried out in a dose of about 5.0E12 atoms/$cm^2$ with energy of about 70 KeV.

Referring to FIG. 13, the simulation result using a process simulator (named 'T-SUPREM4') and a device simulator (named 'MEDICI') represents that the breakdown voltage value of the isolation film is a peak value when the trench depth of STI is 1000 Å under ion implantation conditions (performed in a dose of about 0.8E12 atoms/$cm^2$ with energy of about 50 KeV) for controlling the threshold voltage of the high voltage NMOS transistor, as shown in FIG. 13.

This indicates that the doping profile of ion implantation process for controlling the threshold voltage of the high voltage NMOS transistor reinforces the bottom of the isolation region as the trench depth of STI becomes shallow. It shows that the doping profile at the bottom of STI rather than trench depth itself of STI is more important factor until the trench depth of STI becomes 3000 Å. This is because more wider profile could be obtained than a case where the trench depth only is deep and the doping concentration is low due to the diffusion by a subsequent thermal process, since the shallower the trench depth of STI, the higher the doping concentration due to ion implantation process for controlling the threshold voltage of the high voltage NMOS transistor.

As shown in FIG. 13, there exists the peak value of the breakdown voltage of the isolation film when the trench depth of STI is 1000 Å. It, however, does not meet a current target, 27V.

Figure 14:
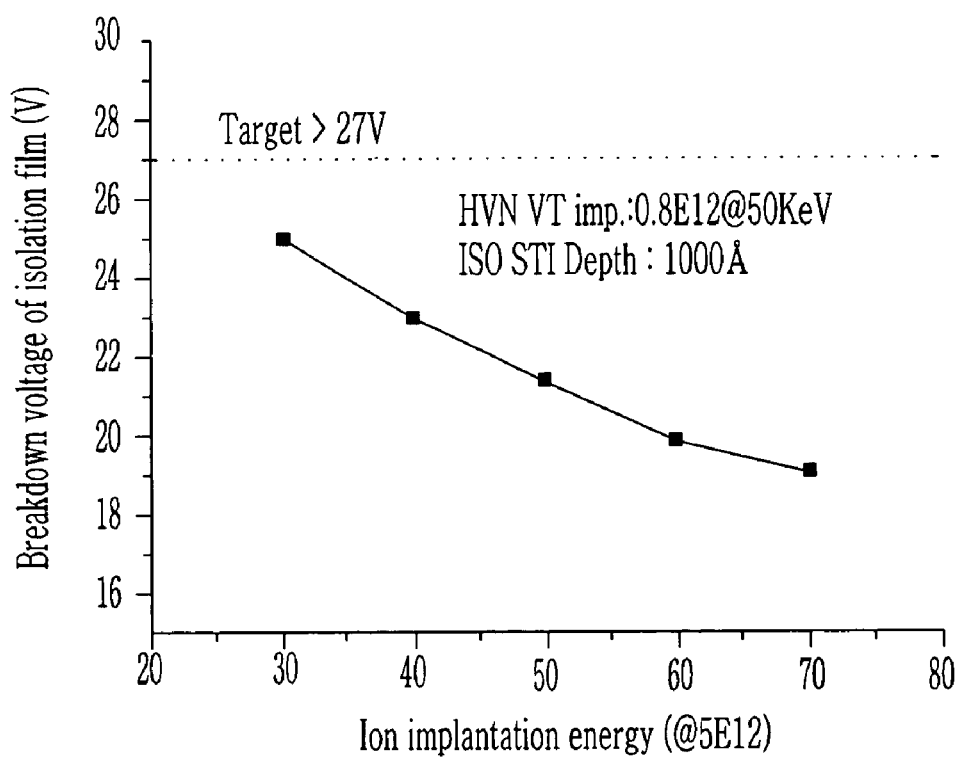
FIG. 14 is a graph showing the result of the breakdown voltage depending on an ion implantation process for formation of a source/drain in a high voltage NMOS transistor.

FIG. 14 is a graph showing the result that the breakdown voltage of the isolation film depending on ion implantation process for formation of the source/drain in the high voltage NMOS transistor. In FIG. 14, there is shown a graph where ion implantation process for controlling the threshold voltage of the high voltage NMOS transistor is performed in a dose of about 0.8E12 atoms/cm$^2$ with energy of about 50 KeV and the shallow trench is formed with a thickness of 1000 Å.

FIG. 14 is a simulation result where DDD energy of the high voltage NMOS transistor is lowered. As can be seen from FIG. 14, the lower the ion implantation energy for forming the DDD of the high voltage NMOS transistor, the better the isolation film punch characteristic. If energy is lowered below 30 KeV, it may cause reduction in an active on-current and a junction breakdown voltage. It is thus preferred that ion implantation process is performed 30 KeV or higher, considering the process margin.

As shown in FIG. 14, even when the DDD ion implantation energy of the high voltage NMOS transistor is 30 KeV, it still does not satisfy the target breakdown voltage, 27V. This is mainly caused by punch leakage between the junctions rather than leakage current between the junction and the substrate. In order to compensate for it, accordingly, it is required that the ion implantation energy for controlling the threshold voltage of the high voltage NMOS transistor be a little increased.

Of course, if the ion implantation energy for controlling the threshold voltage of the high voltage NMOS transistor is increased, there is a possibility that the back-bias threshold voltage will be increased due to an increase in the body effect. For this reason, the ion implantation energy must be set within a proper range not to significantly increase the back-bias threshold voltage.

Figure 15:
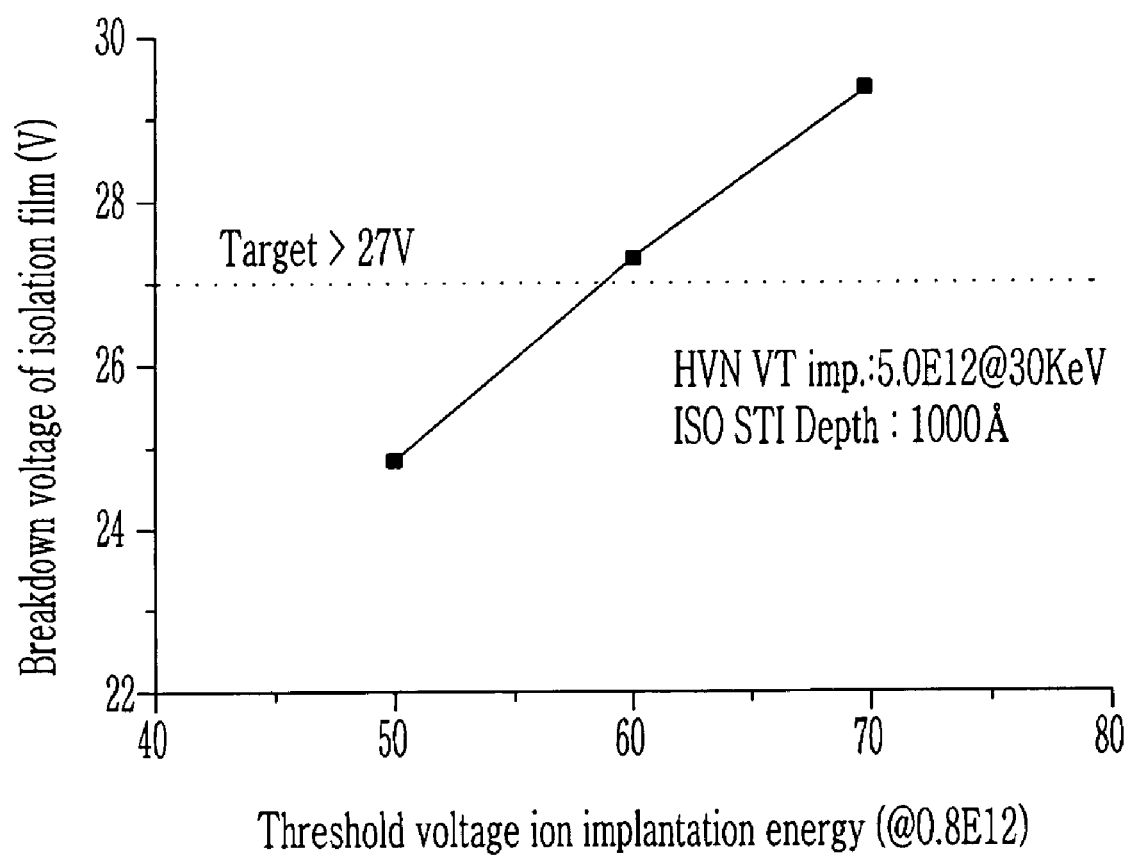
FIG. 15 is a graph showing the result of the breakdown voltage depending on an ion implantation process for controlling a threshold voltage in the high voltage NMOS transistor.

FIG. 15 is a graph showing the result that the breakdown voltage of the isolation film depending on ion implantation process for controlling the threshold voltage of the high voltage NMOS transistor. In FIG. 15, there is shown a graph where ion implantation process for forming the source/drain of the DDD structure in the high voltage NMOS transistor is performed in a dose of about 5.0E12 atoms/cm$^2$ with energy of about 30 KeV and the shallow trench is formed with a thickness of 1000 Å.

As shown in FIG. 15, if the ion implantation energy for controlling the threshold voltage of the high voltage NMOS transistor is 60 KeV or higher, it seems to satisfy the breakdown voltage 27V of the isolation film, whose values are indicated in Table below:

TABLE 1

| | | | |
|---|---|---|---|
| Ion implantation process for controlling the threshold voltage of the high voltage NMOS transistor | 8.0E11@50 KeV | 8.0E11@60 KeV | 8.0E11@70 KeV |
| STI depth | | 1000 Å | |
| DDD ion implantation process of the high voltage NMOS transistor | | 5.0E12@30 KeV | |
| Isolation film punch | 24.9 V | 27.3 V | 29.3 V |

In this case, a result where a conventional condition and a new condition according to the preferred embodiment of the present invention are compared with respect to characteristics of the transistor in the active region, is listed in Table 2 below:

TABLE 2

| | Prior art | Present Embodiment | |
|---|---|---|---|
| Ion implantation process for controlling the threshold voltage of the high voltage NMOS transistor | 8.0E11@50 KeV | 8.0E11@60 KeV | 8.0E11@70 KeV |
| DDD ion implantation process of the high voltage NMOS transistor | 5.0E14@70 KeV | 5.0E14@30 KeV | |
| Threshold voltage (when OV is applied to the substrate) | 0.868 V | 0.826 V | 0.774 V |
| Threshold voltage (when −20 V is applied to the substrate) | 1.976 V | 2.096 V | 2.109 V |
| Saturation current ($I_{dsat}$@1.8 V) | 10.0 µA/µm | 9.7 µA/µm | 10.7 µA/µm |
| Saturation current ($I_{dsat}$@3 V) | 41.8 µA/µm | 38.4 µA/µm | 39.7 µA/µm |
| Drain junction breakdown voltage | 38.0 V | 32.4 V | 31.9 V |

From Table 1 and Table 2, it can be seen that the drain junction breakdown voltage meets the target (>27V) and the threshold voltage value when the back bias is 20V is not significantly increased. It is therefore possible to keep the almost same characteristic as the prior art, while reducing the number of a mask and the process step.

Figure 16A:
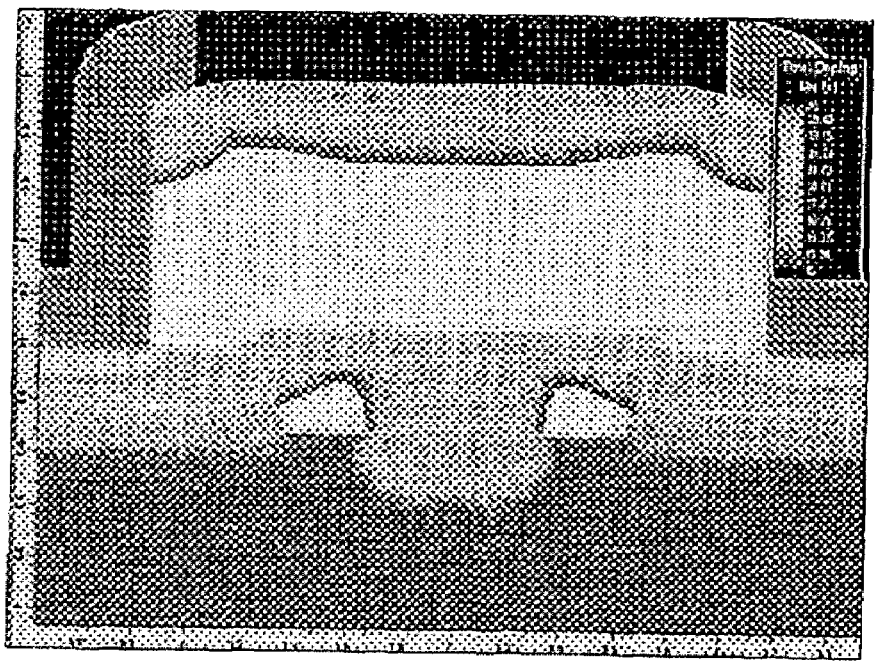
FIGS. 16A and 16B shows a two-dimensional structural doping profile of the isolation film.
Figure 16B:
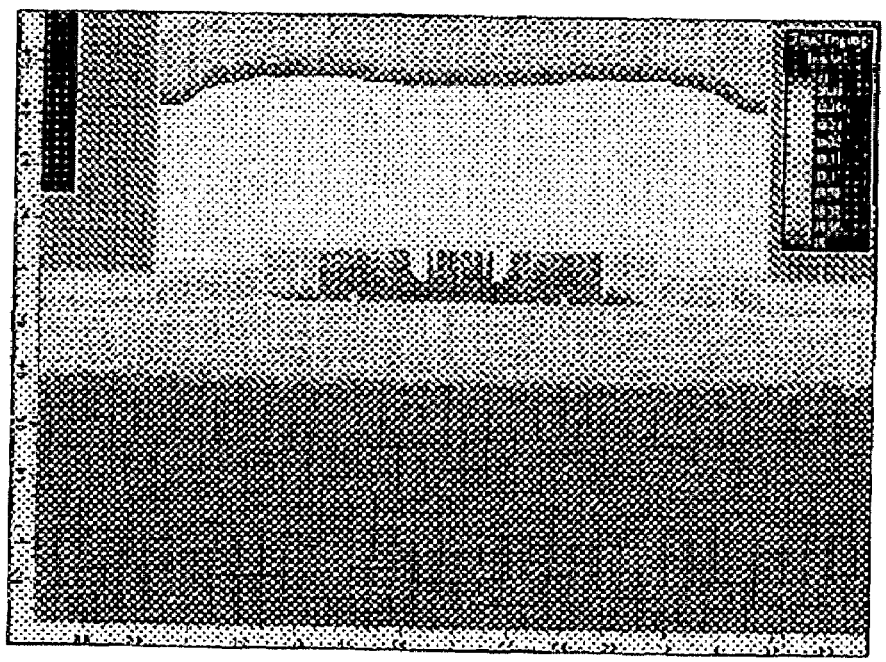

FIG. 16A shows a prior art process and FIG. 16B shows a two-dimensional structural doping profile of the isolation film.

In the case of the prior art process, since field stop ion implantation of the high voltage NMOS transistor in the field region is affected in the active region with 0.5 um overlap, a boron (B) doping profile locally exists in the field region, as shown in FIG. 16A. Meanwhile, in a new process according to the present invention, if the trench depth of STI is lowered, the doping profile of ion implantation process for controlling the threshold voltage of the high voltage NMOS transistor is uniformly distributed over the field region.

As described above, conventionally, an ion implantation process for controlling a threshold voltage of a high voltage NMOS transistor and a field stop ion implantation of the high voltage NMOS transistor has been performed separately. In the present invention, however, only one ion implantation process is carried out using only a single mask (mask for controlling the threshold voltage of the high voltage NMOS transistor) in place of twice ion implantations. It is thus possible to reduce the entire process steps and the number of masks. Therefore, the present invention has effects that it can reduce the number of the mask by one compared to the prior art process, and the process step by three steps, while keeping the almost same transistor characteristics as the prior art. As a result, it is possible to reduce the entire production cost while keeping intact device functions.

It has been described in the above description that one layer is located on the other layer. This, however, will mean that one layer may be located immediately on the other layer and a third layer may be intervened between them. Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of manufacturing a high voltage transistor in a flash memory device, comprising:
    performing a first ion implantation process for controlling a threshold voltage of a high voltage transistor for a semiconductor substrate and for preventing a punch leakage at a bottom of an isolation film;
    forming a gate oxide film for a high voltage device on the semiconductor substrate;
    sequentially forming a polysilicon film and a pad nitride film on the resulting structure including the gate oxide film;
    forming a shallow trench that extends into the semiconductor substrate by sequentially etching a portion of the pad nitride film, the first polysilicon film and the semiconductor substrate;
    filling the shallow trench with an insulating film to form the isolation film;
    removing the pad nitride film to expose the polysilicon film; and
    performing a second ion implantation process to form a source/drain junction of the high voltage transistor.

2. The method as claimed in claim 1, wherein the first ion implantation process for controlling the threshold voltage of the high voltage transistor is performed with a high energy in the range of about 60 KeV to 80 KeV so as to prevent punch leakage at a bottom of the isolation film of the shallow trench.

3. The method as claimed in claim 2, wherein the first ion implantation process for controlling the threshold voltage of the high voltage transistor is performed with a dose in the range of about $8.0E11$ atoms/cm$^2$ to $1.5E12$ atoms/cm$^2$.

4. The method as claimed in claim 1, wherein the shallow trench is formed with a depth in the range of about 1000 Å to 2000 Å so as to prevent punch leakage current at a bottom of the isolation film.

5. The method as claimed in claim 1, wherein the second ion implantation process for forming the source/drain junction of the high voltage transistor is performed with a low energy in the range of about 30 KeV to 50 KeV in order to further prevent punch leakage of the isolation film due to the shallow trench.

6. The method as claimed in claim 5, wherein the second ion implantation process for forming the source/drain junction of the high voltage transistor is performed with a low dose in the range of about $3.0E12$ atoms/cm$^2$ to $1E13$ atoms/cm$^2$ so as to satisfy a high drain junction breakdown voltage.

7. The method as claimed in claim 1, further comprising depositing a polysilicon film on the gate oxide film for the high voltage device before the pad nitride film is formed.

8. A method of manufacturing a transistor in a flash memory device, comprising:
    performing a first ion implantation process for controlling a threshold voltage of a high voltage transistor and for preventing a punch leakage at a bottom of an isolation film;
    forming a first gate oxide film for the high voltage transistor and a second gate oxide film for a low voltage transistor on the semiconductor substrate;
    sequentially forming a polysilicon film and a pad nitride film on an entire structure including the first gate oxide film and the second gate oxide film;
    forming a shallow trench that extends into the semiconductor substrate by sequentially etching a portion of the pad nitride film, the first polysilicon film and the semiconductor substrate;
    forming the isolation film by burying the shallow trench with an insulating film;
    removing the pad nitride film to expose the polysilicon film; and
    performing a second ion implantation process to form a source/drain.

9. The method as claimed in claim 8, wherein the first ion implantation process for controlling the threshold voltage of the high voltage transistor is performed with a high energy in the range of about 60 KeV to 80 KeV so as to prevent the punch leakage at the bottom of the isolation film of the shallow trench.

10. The method as claimed in claim 9, wherein the first ion implantation process for controlling the threshold voltage of the high voltage transistor is performed with a dose in the range of about $8.0E11$ atoms/cm$^2$ to $1.5E12$ atoms/cm$^2$.

11. The method as claimed in claim 8, wherein the shallow trench is formed with a depth in the range of about 1000 Å to 2000 Å so as to prevent punch leakage current at a bottom of the isolation film.

12. The method as claimed in claim 8, wherein the second ion implantation process for forming the source/drain junction of the high voltage transistor is performed with a low energy in the range of about 30 KeV to 50 KeV in order to prevent a punch leakage of the isolation film due to the shallow trench.

13. The method as claimed in claim 12, wherein the second ion implantation process for forming the source/drain junction of the high voltage transistor is performed with a low dose in the range of about 3.0E12 atoms/cm$^2$ to 1E13 atoms/cm$^2$ so as to satisfy a high drain junction breakdown voltage.

* * * * *